United States Patent
Li et al.

(10) Patent No.: US 8,258,634 B2
(45) Date of Patent: Sep. 4, 2012

(54) CONTACT PAD ARRAY

(75) Inventors: Chung-Lung Li, Hsin-Chu (TW); Yun-Chung Lin, Hsin-Chu (TW)

(73) Assignee: AU Optronics Corp. Science-Based Industrial Park, Hsin-Chu (TW)

( * ) Notice: Subject to any disclaimer, the term of this patent is extended or adjusted under 35 U.S.C. 154(b) by 29 days.

(21) Appl. No.: 13/071,490

(22) Filed: Mar. 24, 2011

(65) Prior Publication Data
US 2012/0104620 A1 May 3, 2012

(30) Foreign Application Priority Data
Nov. 1, 2010 (TW) .............................. 99137512 A (51) Int. Cl.
H01L 23/48 (2006.01)
H01L 23/52 (2006.01)
H01L 29/40 (2006.01)

(52) U.S. Cl. ........................................ 257/786; 257/784

(58) Field of Classification Search .................. 257/784, 257/786, 778
See application file for complete search history.

(56) References Cited

U.S. PATENT DOCUMENTS

| | | | |
|---|---|---|---|
| 6,849,956 B2* | 2/2005 | Shigihara | 257/786 |
| 8,004,092 B2* | 8/2011 | Lin et al. | 257/781 |
| 8,125,072 B2* | 2/2012 | Lachner et al. | 257/693 |
| 2005/0279838 A1* | 12/2005 | Wang et al. | 235/492 |
| 2005/0281010 A1* | 12/2005 | Wang et al. | 361/752 |
| 2010/0085526 A1* | 4/2010 | Chen et al. | 349/152 |
| 2011/0133184 A1* | 6/2011 | Kodera | 257/48 |

* cited by examiner

Primary Examiner — S. V Clark
(74) Attorney, Agent, or Firm — Winston Hsu; Scott Margo (57) ABSTRACT

A contact pad array is provided. The contact pad array includes a plurality of first contact pads and a plurality of second contact pads. The first contact pads are arranged along the first direction. Each first contact pad includes two first lengthwise sides and two widthwise sides. The second contact pads are arranged along the first direction. Each second contact pad includes two second lengthwise sides and two second widthwise sides. The length of the second lengthwise side is substantially shorter than that of the first lengthwise side, and the width of the second widthwise side is substantially larger than that of the first widthwise side. The projection of the first widthwise side of each first contact pad on the first direction is completely within the projection of the second widthwise side of the corresponding second contact pad on the first direction.

14 Claims, 9 Drawing Sheets

CONTACT PAD ARRAY

BACKGROUND OF THE INVENTION

1. Field of the Invention

The present invention relates to a contact pad array, and more particularly, to a contact pad array with high space utilization efficiency, in which projections of contact pads disposed in the same column overlap with each other on the column direction.

2. Description of the Prior Art

Due to popularity of multi-media applications, display screens with small sizes can no longer satisfy public requirements, so that manufacturers are devoted to developing larger and thinner display panels. Thus, the number of pixels of the display panels should be increased to maintain display resolutions and to provide exquisite images. Therefore, the number of input terminals of scan lines and data lines should be increased when designing the display panels with large sizes.

Figure 1:
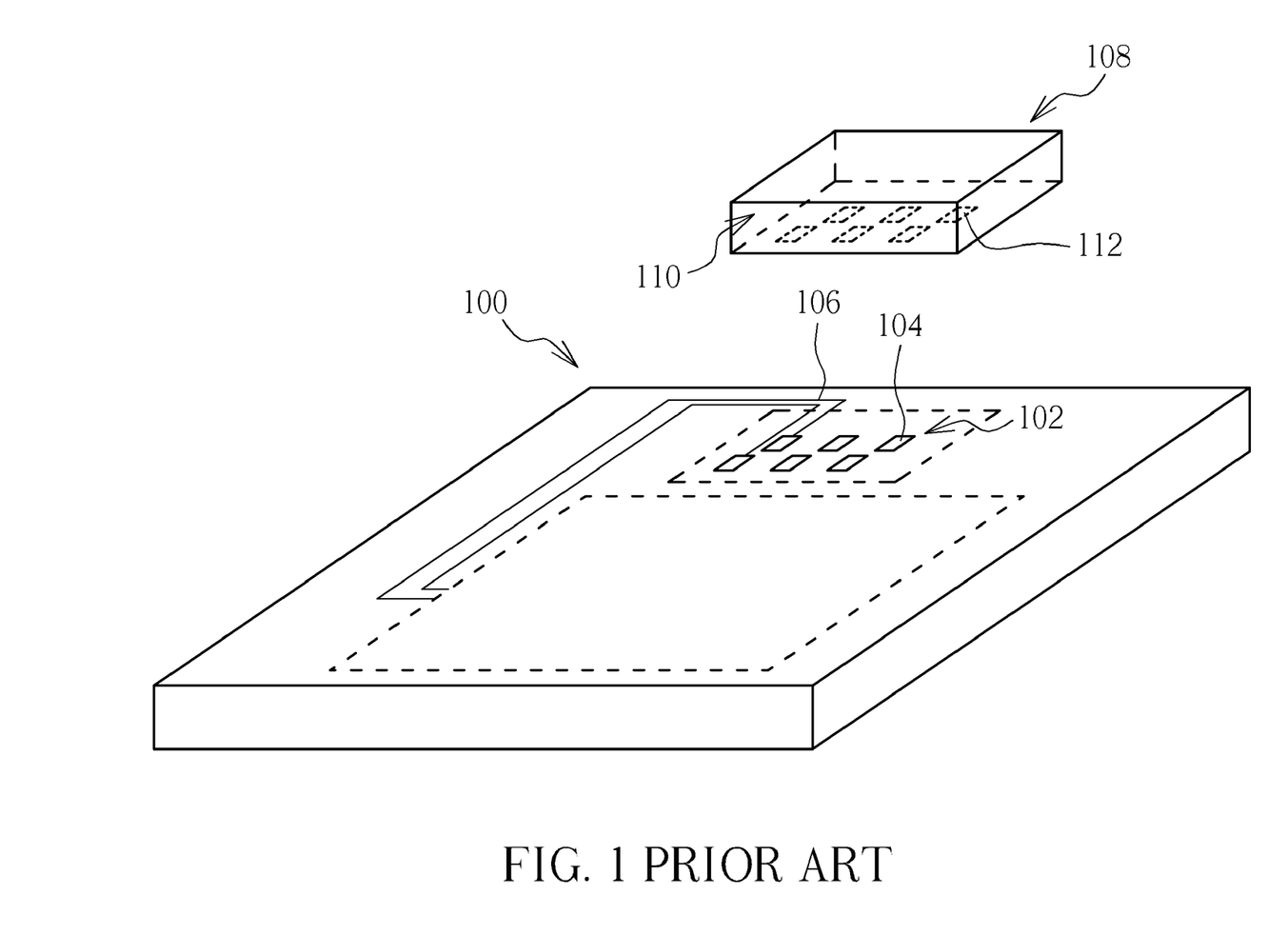
FIG. 1 is a schematic diagram illustrating configurations of a conventional display panel and a driver chip.

For example, in a QVGA (quarter Video Graphics Array) display with a resolution of 320×240, 960 output terminals (320×3(RGB)) are required for data lines, and 240 output terminals are required for scan lines, thus, at least 1200 output terminals are required; in a VGA display with a resolution of 640×480, at least 2400 (640×3+480) output terminals are required; and also, in a UXGA display with a resolution of 1600×1200, at least 6000 (1600×3+1200) output terminals are required. Therefore, to maintain high display resolutions of the display panels with large sizes, the number of output terminals should be also increased to provide a signal for each data line or each scan line. Generally, the output signals are provided by driver chips. Please refer to FIG. 1, which schematically illustrates configurations of a conventional display panel and a driver chip. As shown in FIG. 1, a contact pad array 102 is disposed on the display panel 100. The contact pad array 102 includes a plurality of contact pads 104, and each contact pad 104 is correspondingly connected to a wire 106. Also, a contact pad array 110 is disposed on the driver chip 108, and the contact pad array 110 includes a plurality of contact pads 112. Additionally, an arrangement of the contact pad array 110 disposed on the driver chip 108 corresponds to the contact pad array 102 disposed on the display panel 100 under the driver chip 108. As a result, after installing the driver chip 108 to the display panel 100, signals generated by the driver chip 108 can be transmitted the to the contact pad array 102 disposed on the display panel 100 via the contact pad array 110, and then the signals are respectively transmitted to data lines (not shown) and scan lines (not shown) disposed on the display panel 100 by the wires 106 for the sake of driving display devices (not shown) disposed on the display panel 100.

Figure 2:
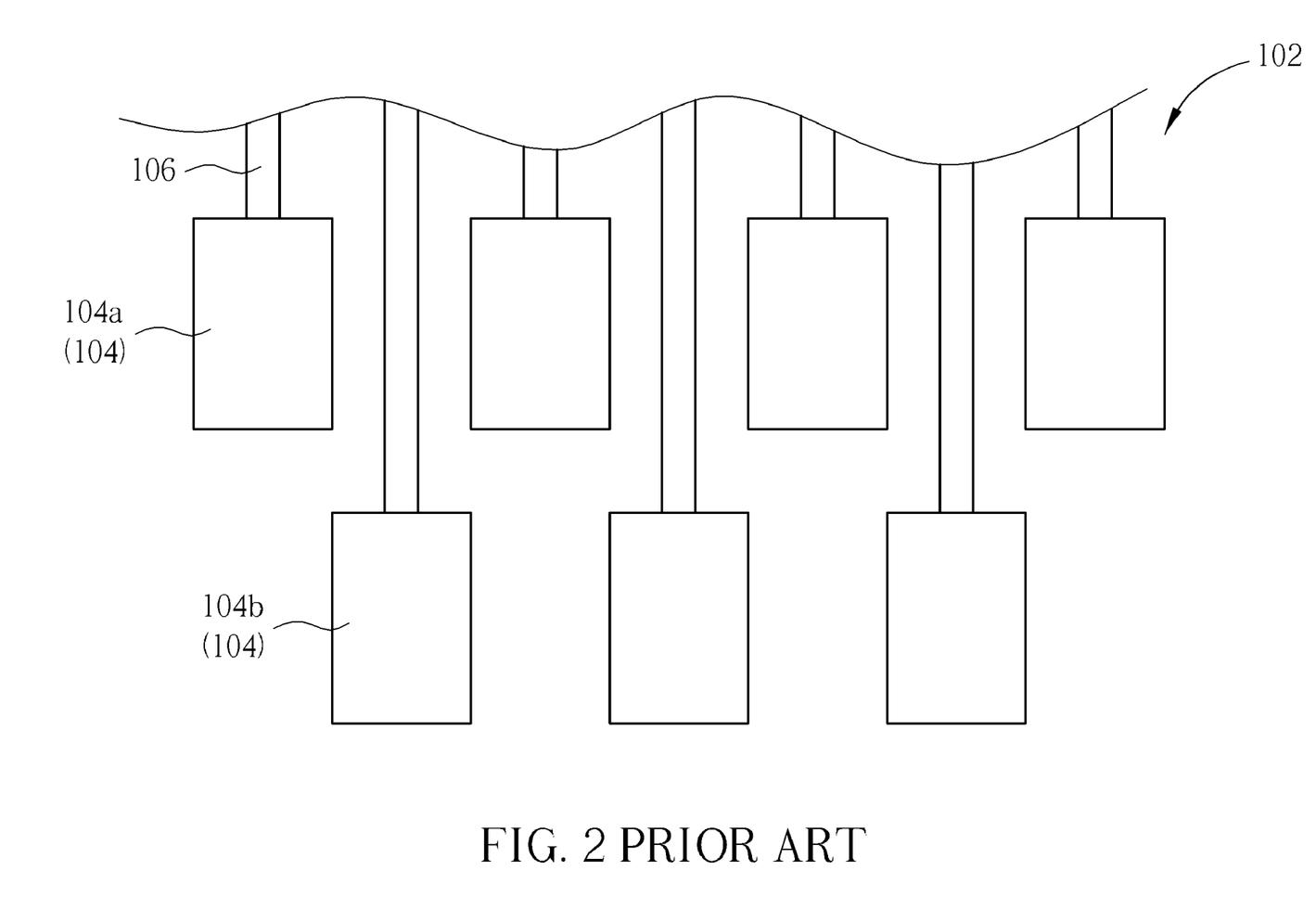
FIG. 2 is a schematic diagram illustrating an arrangement of a conventional contact pad array.

As previously described, the display panels with large sizes and high display resolutions require more contact pads, and therefore the arrangements of the conventional contact pad arrays 102, 110 are no longer favorable for present requirements. Please refer to FIG. 2, which schematically illustrates an arrangement of the conventional contact pad array. As shown in FIG. 2, in order to ensure the wires 106 are connected to each contact pad 104, respectively, the contact pads 104 of the contact pad array 102 are usually disposed with a staggered arrangement. In other words, any two of the adjacent contact pads, such as 104a and 104b, do not horizontally overlap with each other, so that the wires 106 can be perpendicularly extended without electrical connections between each other. Wherein a projection area of each contact pad is the same. In accordance with FIG. 2, however, the staggered arrangement is disadvantageous for space utilization, since a portion of space is not used. For this reason, when the number of the contact pads 104 is increased, the areas of the contact pad arrays 102, 110 with the conventional arrangement will be highly magnified and therefore unfavorable for product designing.

SUMMARY OF THE INVENTION

It is therefore one of the objectives of the present invention to provide a contact pad array to solve the problem of low space utilization efficiency of the conventional contact pad array.

In accordance with the embodiment of the present invention, a contact pad array is provided. In the contact pad array, contact pad arrays are disposed on a surface, the surface has an edge, and the surface includes a first direction substantially parallel to the edge and a second direction substantially perpendicular to the edge defined thereon. The contact pad array includes a plurality of first contact pads and a plurality of second contact pads. The first contact pads are arranged along the first direction, in which each first contact pad includes two first widthwise sides substantially parallel to the first direction and two first lengthwise sides substantially parallel to the second direction. The second contact pads are arranged along the first direction, and the first contact pads and the second contact pads are arranged along the second direction from the edge of the surface. Moreover, each first contact pad corresponds to one of the second contact pads in the second direction, in which each second contact pad includes two second widthwise sides substantially parallel to the first direction and two second lengthwise sides substantially parallel to the second direction. Also, the second lengthwise side is substantially shorter than the first lengthwise side, and the second widthwise side is substantially wider than the first widthwise side. In addition, a projection of the first widthwise side of each first contact pad on the first direction is completely within a projection of the second widthwise side of the corresponding second contact pad on the first direction.

In accordance with the present invention, the contact pad array is able to accommodate more contact pads within the same area to lower fabrication costs. Thus, the contact pad array of the present invention is more suitable for display panels with large sizes or high display resolutions.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention for one skilled in the art, preferred embodiments will be detailed as follows. The preferred embodiments of the present invention are illustrated in the accompanying drawings with numbered elements to elaborate the contents and effects to be achieved.

Figure 3:
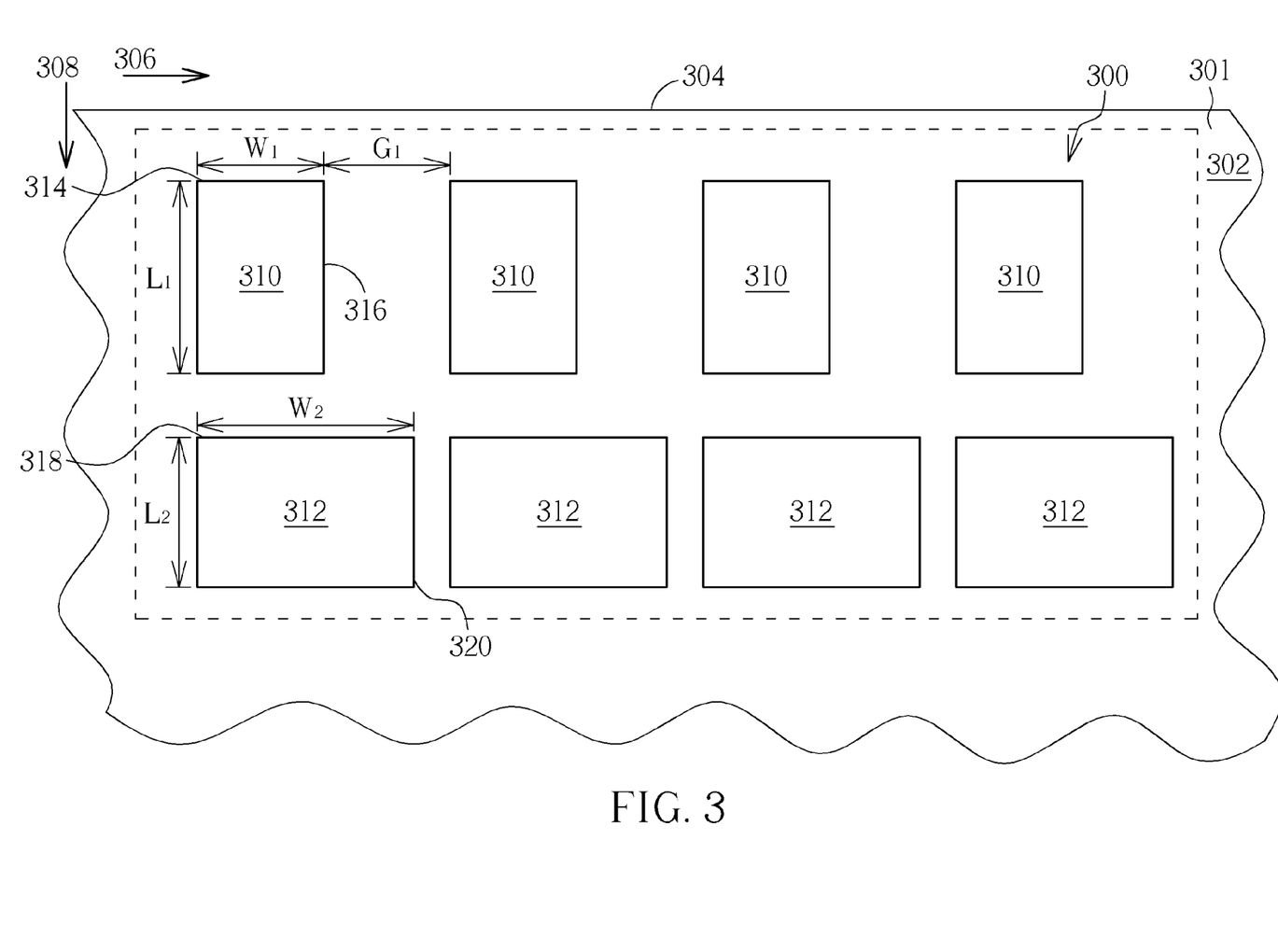
FIG. 3 is a schematic diagram illustrating an arrangement of a contact pad array according to an embodiment of the present invention.

Please refer to FIG. 3, which schematically illustrates an arrangement of a contact pad array according to an embodiment of the present invention. As shown in FIG. 3, in this embodiment, the contact pad array 300 is disposed on a surface 302, such as the surface 302 of a driver chip 301. The surface 302 has an edge 304, and the contact pad array 300 is disposed on the surface 302 near the edge 304. With respect to an extension direction of the edge 304, the surface 302 has a first direction 306 substantially parallel to the edge 304 and a second direction 308 substantially perpendicular to the edge 304 defined thereon. Nevertheless, in accordance with other embodiments, the first direction 306 could be Y direction in a rectangular coordinate system (also known as Cartesian coordinate system), and the second direction 308 could be X direction in the rectangular coordinate system. As shown in FIG. 3, the contact pad 300 includes a plurality of first contact pads 310 and a plurality of second contact pads 312. The first contact pads 310 are substantially arranged along the first direction 306, and each first contact pad 310 has two first widthwise sides 314 substantially parallel to the first direction 306 and two first lengthwise sides 316 substantially parallel to the second direction 308. Similarly, the second contact pads 312 are substantially arranged along the first direction 306, and each second contact pad 312 has two second widthwise sides 318 substantially parallel to the first direction 306 and two second lengthwise sides 320 substantially parallel to the second direction 308. Moreover, the first contact pads 310 and the second contact pads 312 are sequentially arranged along the second direction 308 from the edge 304, and each first contact pad 310 corresponds to one of the second contact pads 312.

Instead of adopting the conventional staggered arrangement in which the contact pads 104 do not overlap with each other as shown in FIG. 2, one of the features of the present invention is that the projection of the first widthwise side 314 of each first contact pad 310 on the first direction 306 is completely within the projection of the second widthwise side 318 of the corresponding second contact pad 312 on the first direction 306. In other words, the projection of the second contact pad 312 on the first direction 306 completely covers the projection of the first contact pad 310 on the first direction 306, i.e. a projective length of the second contact pad 312 on the first direction 306 is substantially larger than a projective length of the first contact pad 310 on the first direction 306. Thus, a required width (W1+G1) for the first contact pad 310 and the second contact pads 312 disposed in the same column on the first direction 306 can be shortened. In accordance with the preferred embodiment as shown in FIG. 3, one of the first lengthwise sides 316 of the first contact pad 310 is aligned with one of the second lengthwise sides 320 as a straight line along the second direction 308 to obtain optimized space utilization efficiency. In other embodiments of the present invention, the first lengthwise sides 316 and the second lengthwise sides 320 do not have to be aligned as a straight line along the second direction 308.

Additionally, in accordance with this embodiment, a width W1 of each first widthwise side 314 is substantially smaller than a width W2 of each second widthwise sides 318 in order to dispose corresponding wires (not shown) for electrically connecting the contact pads. Accordingly, a length L2 of each second lengthwise side 320 can be shortened, and thus the length L1 of each first lengthwise side 316 becomes substantially larger than the length L2 of each second lengthwise side 320. Consequentially, a required length for the first contact pad 310 and the second contact pads 312 disposed in the same column along the second direction 308 can also be shortened.

For instance, the length L1 of each first lengthwise side 316 is substantially 100 micrometers, the length L2 of each second lengthwise side 320 is substantially 60 micrometers, the width W1 of each first widthwise side 314 is substantially 15 micrometers, the width W2 of each second widthwise side 318 is substantially 24 micrometers, and a gap G1 between two adjacent first contact pads 310 is substantially 15 micrometers. On condition that the contact pads remain well functioned, the length and the width of each contact pad can be adjusted according to product specifications based on the principle that the projection of the first widthwise side 314 of each first contact pad 310 on the first direction 306 is completely within the projection of the second widthwise side 318 of the corresponding second contact pad 312 on the first direction 306.

Figure 4:
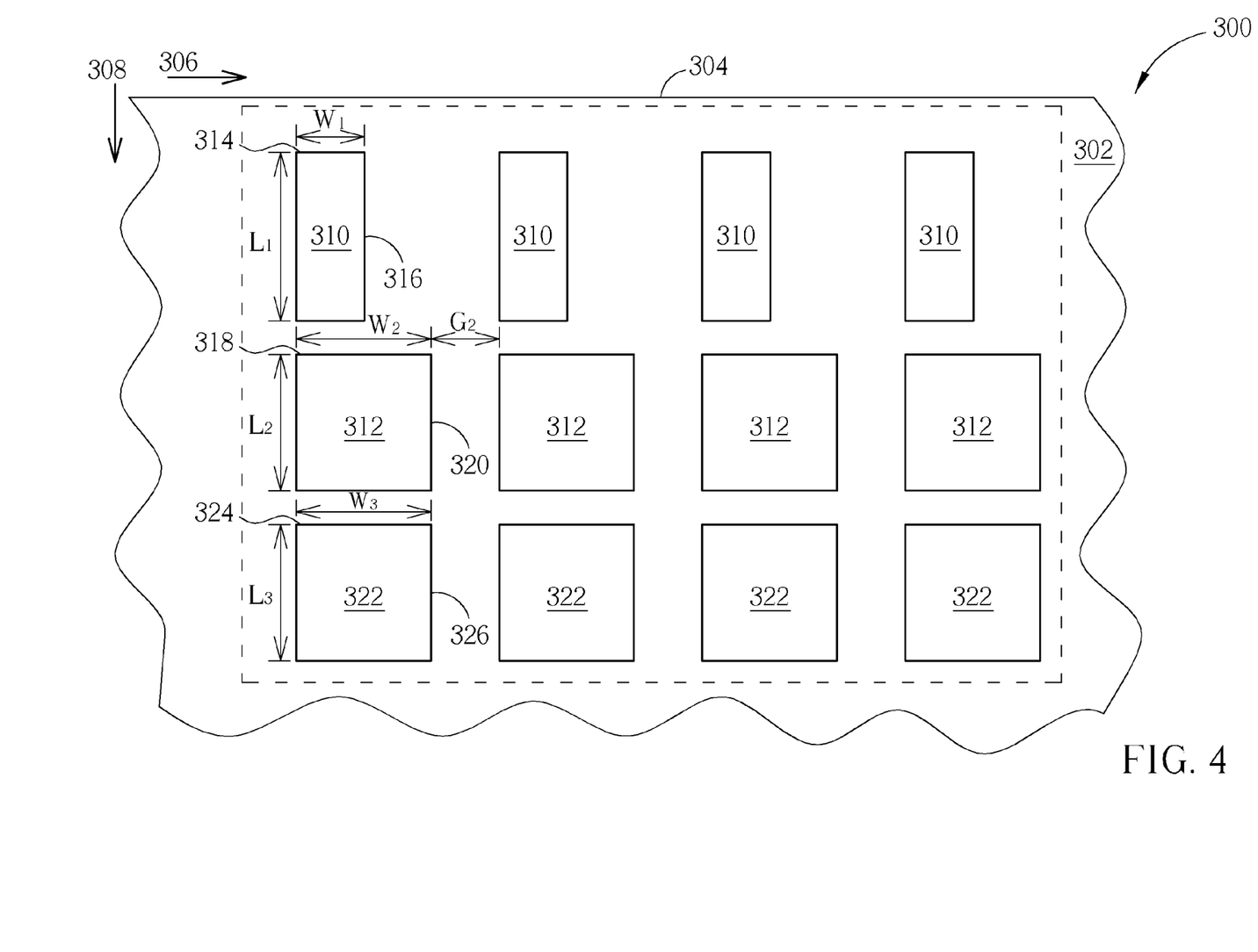
FIG. 4 through FIG. 5 are schematic diagrams illustrating arrangements of contact pad arrays according to other two embodiments of the present invention.
Figure 5:
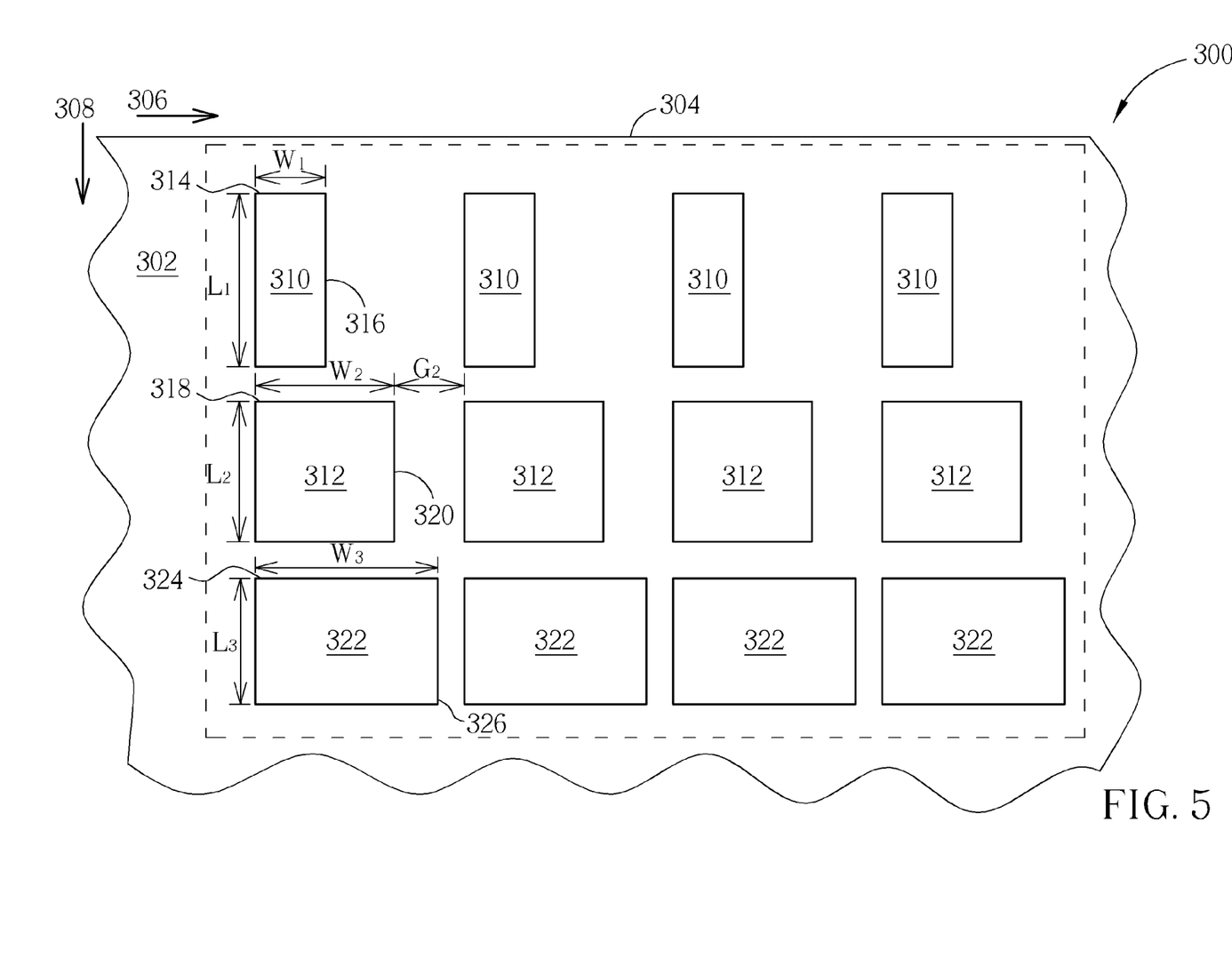

In addition to the first contact pads 310 and the second contact pads 312, a plurality of third contact pads 322 may be optionally disposed on the contact pad array 300 of the present invention wherever necessary. Please refer to FIG. 4 and FIG. 5, which respectively illustrate arrangements of the contact pad array according to other two embodiments of the present invention. As shown in FIG. 4 and FIG. 5, in addition to the aforementioned first contact pads 310 and second contact pads 312, the contact pad array 300 further includes a plurality of third contact pads 322 arranged along the first direction 306. The first contact pads 310, the second contact pads 312, and the third contact pads 322 are sequentially arranged along the second direction 308 from the edge 304. Each first contact pad 310 corresponds to one of the second contact pads 312 and one of the third contact pads 322 (the three contact pads are disposed in the same column), and each third contact pad 322 includes two third widthwise sides 324 substantially parallel to the first direction 306 and two third lengthwise sides 326 substantially parallel to the second direction 308.

In accordance with the preferred embodiments of the present invention, the length L2 of each second lengthwise side 320 and a length L3 of each third lengthwise side 326 are substantially smaller than the length L1 of each first lengthwise side 316. For instance, in accordance with the embodiment shown in FIG. 4, the length L3 of each third lengthwise side 326 is substantially equal to the length L2 of each second lengthwise side 320. In according with another embodiment shown in FIG. 5, the length L3 of the third lengthwise side 326 is substantially smaller than the length L2 of the second lengthwise side 320. Moreover, the width W2 of each second widthwise side 318 and a width W3 of each third widthwise side 324 are substantially wider than the width W1 of each first widthwise side 314. In the embodiment shown in FIG. 4, the width W3 of each third widthwise side 324 is substantially equal to the width W2 of each second widthwise side 318; and in the embodiment shown in FIG. 5, the width W3 of the third widthwise side 324 is substantially wider than the width W2 of the second widthwise side 318.

In addition, the projection of the first widthwise side 314 on the first direction 306 is completely within the projection of the second widthwise side 318 disposed in the same column, and the projection of the second widthwise side 318 on the first direction 306 is completely within the projection of the third widthwise side 324 disposed in the same column. In accordance with the preferred embodiments of the present invention, one of the first lengthwise sides 316, one of the second lengthwise sides 320, and one of the third lengthwise sides 326 located in the same column are aligned as a straight line along the second direction 308.

In accordance with the embodiment shown FIG. 4, the length L1 is substantially 100 micrometers, the length L2 is substantially 50 micrometers, the length L3 is substantially 50 micrometers; and the width W1 is substantially 12 micrometers, the width W2 is substantially 24 micrometers, the width W3 is substantially 24 micrometers; and a gap G2 between two adjacent second contact pads 312 is substantially 12 micrometers. In accordance with the embodiment shown in FIG. 5, the length L1 is substantially 100 micrometers, the length L2 is substantially 50 micrometers, the length L3 is substantially 40 micrometers; and the width W1 is substantially 12 micrometers, the width W2 is substantially 24 micrometers, the width W3 substantially 30 micrometers; and the gap G2 between two second contact pads 312 is substantially 12 micrometers. On condition that contact pads remain well functioned, the length and the width of each contact pad can be adjusted according to product specifications. In addition, more contact pads, such as fourth contact pads, fifth contact pads, etc., also could be sequentially disposed on the contact pad array 300 along the second direction 308 depending on product designs. Arrangements of the additional contact pads are substantially the same as that of the third contact pads, and thus not redundantly described.

Figure 6:
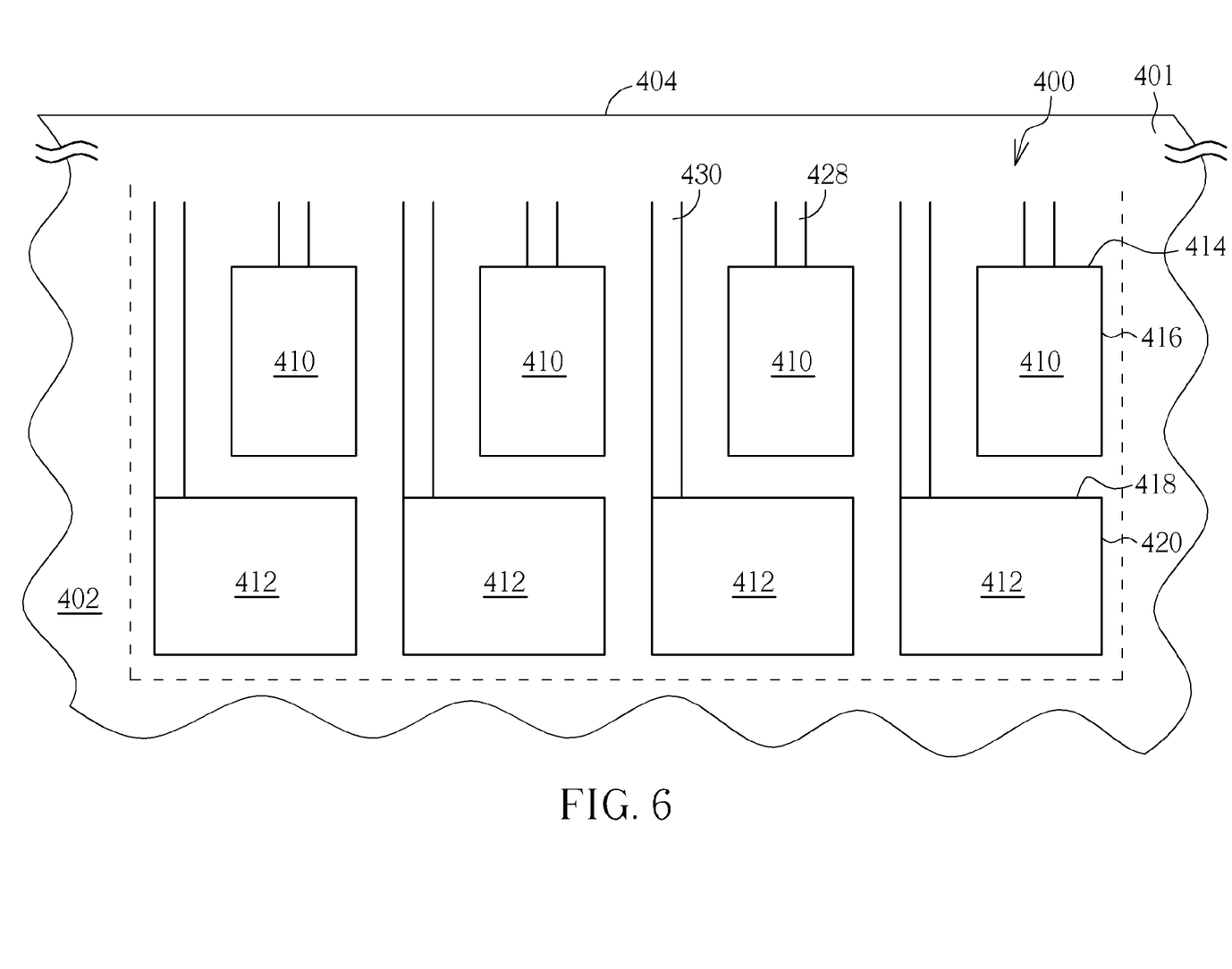
FIG. 6 is a schematic diagram illustrating an arrangement of a contact pad array according to another embodiment of the present invention.

The aforementioned contact pad array 300 is disposed on the driver chip 301 for example, while the contact pad array 300 of the present invention also could be disposed on other devices, such as a display panel. To ensure the contact pad array 300 disposed on the driver chip 301 corresponds to a contact pad array disposed on the display panel, the contact pad array 400 disposed on the display panel is mirror-symmetrically arranged with the contact pad array 300 disposed on the driver chip 301 (refer to FIG. 1). Please refer to FIG. 6, which schematically illustrates an arrangement of the contact pad array according to another embodiment of the present invention, and is illustrated with respect to FIG. 3. As shown in FIG. 6, the contact pad array 400 disposed on the display panel 401 is mirror-symmetrically arranged with the contact pad array 300 disposed on the driver chip 301. In accordance with this embodiment, the contact pad array 400 also includes a plurality of first contact pads 410 and second contact pads 412. Configurations of the contact pad array 400 are substantially the same as the aforementioned contact pad array with respect to FIG. 3, and thus not redundantly described. Additionally, to provide adequate source line signals and scan line signals for the display panel 401, the contact pad array 400 further includes a plurality of first wires 428 and a plurality of second wires 430. The first wires 428 are respectively connected to the first widthwise side 414, which is near the edge 404, of each first contact pad 410, and the second wires 430 are respectively connected to the second widthwise side 418, which is near the edge 404, of each second contact pad 412. The first wires 428 and the second wires 430 are not electrically connected to each other.

Figure 7:
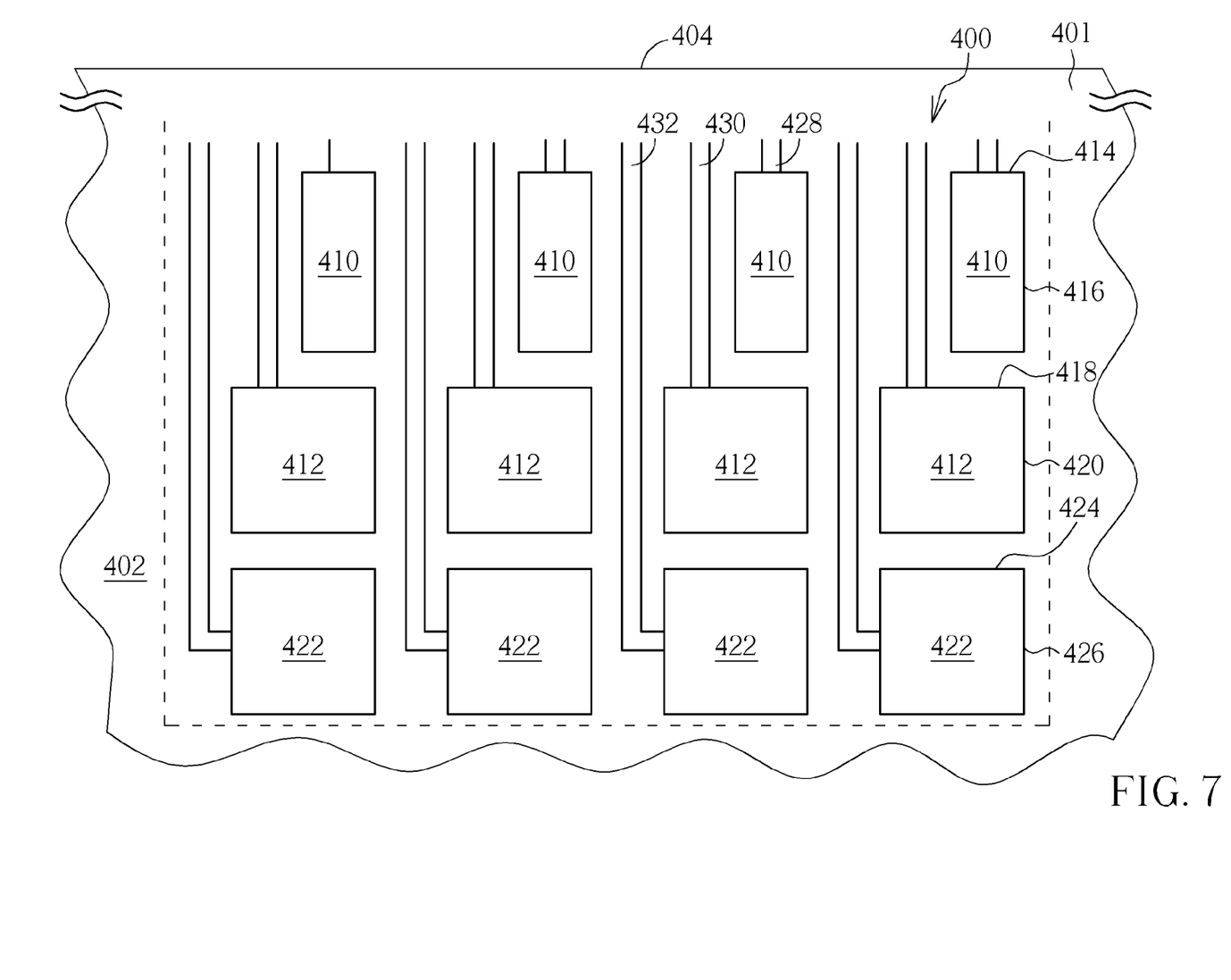
FIG. 7 through FIG. 9 are schematic diagrams illustrating arrangements of contact pad arrays according to other three embodiments of the present invention.
Figure 8:
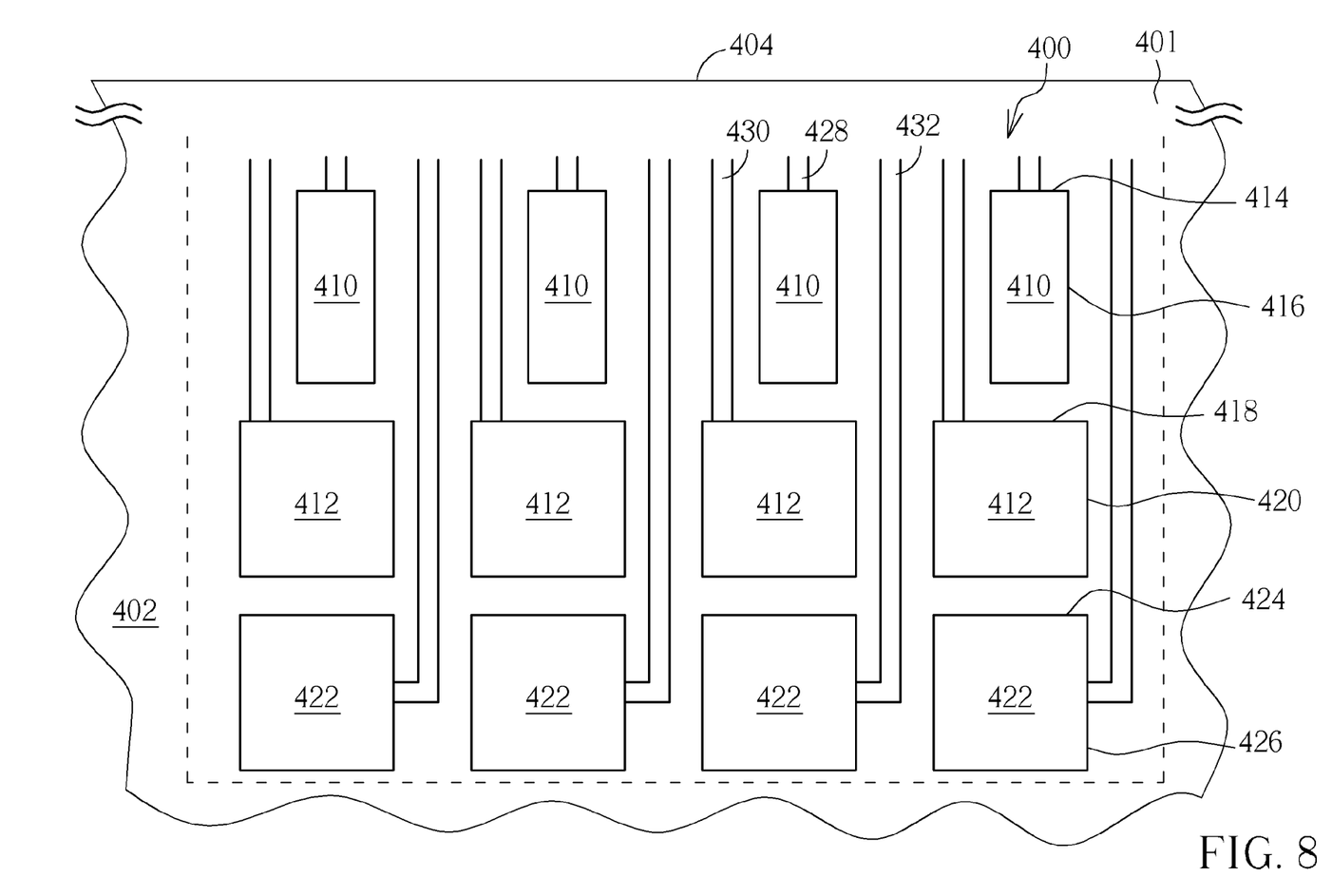
Figure 9:
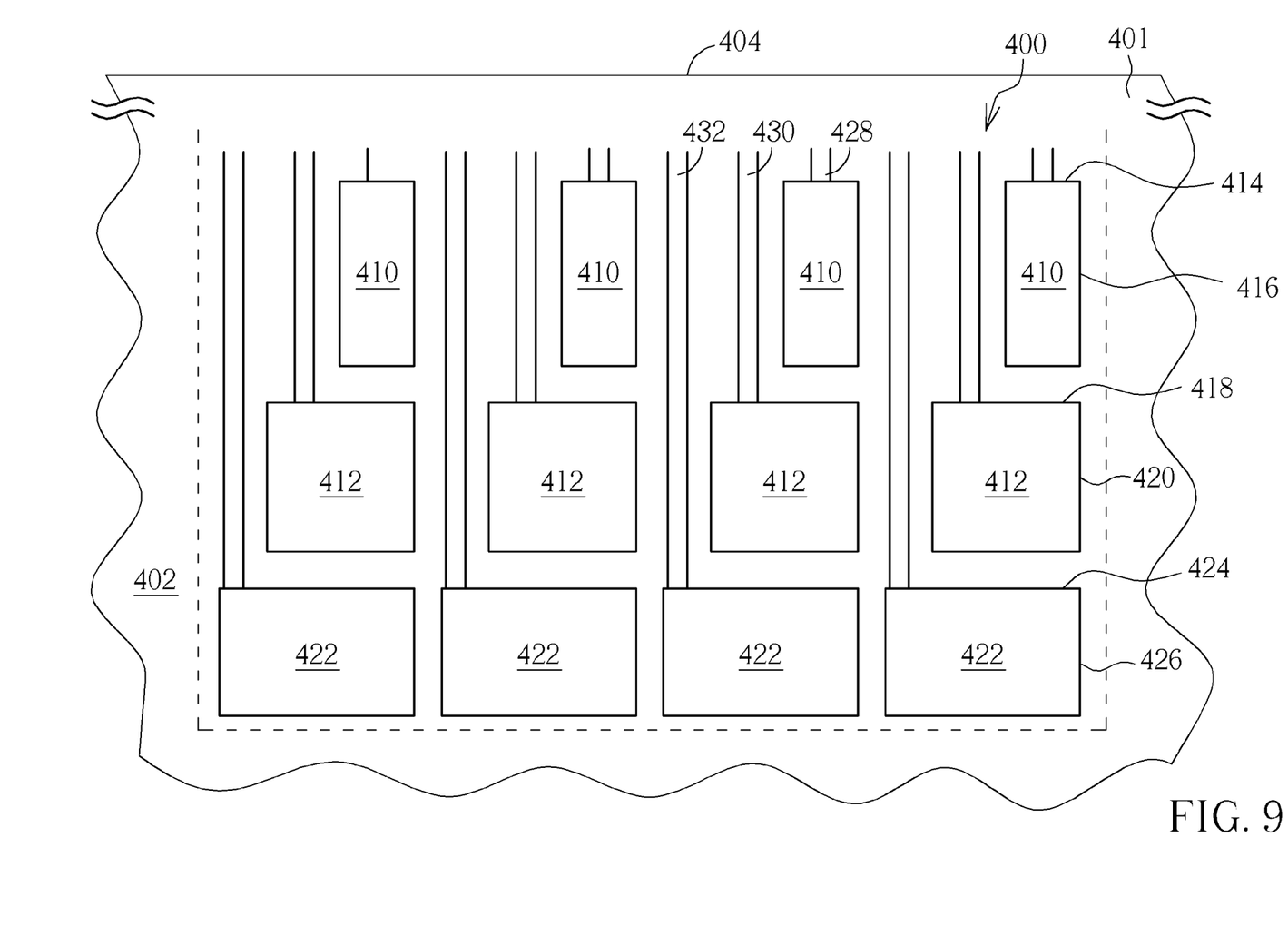

Please refer to FIG. 7 through FIG. 9, which schematically illustrate contact pad arrays according to three different embodiments of the present invention, in which FIG. 7 and FIG. 8 are illustrated with respect to FIG. 4, and FIG. 9 is illustrated with respect to FIG. 5. As shown in FIG. 7 through FIG. 9, according to the three embodiments, the contact pad arrays 400 include not only the aforementioned first contact pads 410, the second contact pads 412, the first wires 428, and the second wires 430, but also a plurality of third contact pads 422 and a plurality of third wires 432. Arrangement of the third contact pads 422 is substantially the same as the aforementioned contact pads with respect to FIG. 4 and FIG. 5, and thus not redundantly described. The third wires 432 are respectively connected to each third contact pad 422. As shown in FIG. 7, the third wires 432 are respectively connected to the left third lengthwise side 426 of each third contact pad 422. Thus, the first wires 428, the second wires 430, and the third wires 432 are relatively located at the same side of the first contact pads 410, the second contact pads 412, and the third contact pads 422 disposed in the same column. In accordance with another embodiment shown in FIG. 8, the third wires 432 are respectively connected to the right third lengthwise side 426 of each third contact pad 422. Thus the first wires 428 and the second wires 430 are relatively located at the same side of the first contact pads 410, the second contact pads 412, and third contact pads 422 disposed in the same column, while the third wires 432 are located at the other side of the contact pads. Additionally, in accordance with still another embodiment of the present invention shown in FIG. 9, the third wires 432 are respectively connected to the third widthwise side 424, which is closer to the edge 404, of each third contact pad 422. Alternatively, in accordance with the embodiment as shown in FIG. 9, the third wires 432 can be connected to one of the third lengthwise sides 426 (left side or right side) of each third contact pad 422 as well. In addition, when the fourth contact pads, the fifth contact pads, or more contact pads are disposed on the contact pad array 400, fourth wires, fifth wires, etc. also could be disposed correspondingly with arrangements substantially the same as the arrangement of the third wires, thus not redundantly described.

To sum up, the present invention provides a contact pad array, which could be disposed on the driver chip or the corresponding display panel. Instead of being alternately arranged on the contact pad array, the contact pads of the present invention are arranged on purpose to make the projection of each contact pad disposed in the same column on the first direction overlap with each other, and therefore to save more space for lowering fabrication costs. It is noted that the contact pad array of the present invention could be disposed on a variety of devices, not limited to the aforementioned driver chips and display panels. For example, the contact pad array could be disposed on electro-optical devices, electrical devices, or semi-conductor devices without shape and configuration limitations. Moreover, the shapes of contact pads are not limited to rectangles in the present invention, the contact pads could be designed to be polygon, circle, or other shapes on demand. All kinds of arrangements of the output terminals with capabilities of providing electrical or electro-optical signals are included in the present invention.

Those skilled in the art will readily observe that numerous modifications and alterations of the device and method may be made while retaining the teachings of the invention.

What is claimed is:

1. A contact pad array, disposed on a surface, wherein the surface comprises an edge, and the surface has a first direction substantially parallel to the edge and a second direction substantially perpendicular to the edge defined thereon, the contact pad array comprising:

a plurality of first contact pads, arranged along the first direction, wherein each first contact pad comprises two first widthwise sides substantially parallel to the first direction and two first lengthwise sides substantially parallel to the second direction; and a plurality of second contact pads, arranged along the first direction, the first contact pads and the second contact pads being sequentially arranged along the second direction from the edge of the surface, and each first contact pad corresponding to one of the second contact pads along the second direction, wherein each second contact pad comprises two second widthwise sides substantially parallel to the first direction and two second lengthwise sides substantially parallel to the second direction, and the second lengthwise side is substantially shorter than the first lengthwise side, the second widthwise side is substantially wider than the first widthwise side, wherein a projection of the first widthwise side of each first contact pad on the first direction is completely within a projection of the second widthwise side of the corresponding second contact pad on the first direction.

2. The contact pad array according to claim 1, wherein one of the first lengthwise sides of each first contact pad and one of the second lengthwise sides of the corresponding second contact pad are aligned along the second direction as a straight line.

3. The contact pad array according to claim 1, further comprising:
a plurality of third contact pads, arranged along the first direction, the first contact pads, second contact pads, and the third contact pads being sequentially arranged along the second direction from the edge of the surface, and each second contact pad corresponding to one of the third contact pads along the second direction, wherein each the third contact pad comprises two third widthwise sides substantially parallel to the first direction and two third lengthwise sides substantially parallel to the second direction, and the third lengthwise side is substantially shorter than the first lengthwise side.

4. The contact pad array according to claim 3, wherein the third lengthwise side is substantially shorter than the second lengthwise side.

5. The contact pad array according to claim 3, wherein the third widthwise side is substantially wider than the second widthwise side.

6. The contact pad array according to claim 3, wherein the third widthwise side is substantially equal to the second widthwise side.

7. The contact pad array according to claim 3, wherein one of the first lengthwise sides of each first contact pad, one of the second lengthwise sides of the second contact pad corresponding to the first contact pad, and one of the third lengthwise sides of the third contact pad corresponding to the second contact pad are aligned along the second direction as a straight line.

8. The contact pad array according to claim 7, wherein the projection of the second widthwise side of each second contact pad on the first direction is completely within a projection of the third widthwise side of the third contact pad corresponding to the second contact pad on the first direction.

9. The contact pad array according to claim 1, wherein the contact pad array is disposed on a chip.

10. The contact pad array according to claim 1, wherein the contact pad array is disposed on a display panel.

11. The contact pad array according to claim 10, further comprising:
a plurality of first wires, respectively connected to the first widthwise side, which is near the edge of the surface, of each first contact pad; and
a plurality of second wires, respectively connected to the second widthwise side, which is near the edge of the surface, of each second contact pad.

12. The contact pad array according to claim 11, further comprising:
a plurality of third contact pads, arranged along the first direction, the first contact pads, the second contact pads, and the third contact pads being sequentially arranged along the second direction from the edge of the surface, and each of the second contact pads corresponding to one of the third contact pads in the second direction, wherein each third contact pad comprises two third widthwise sides substantially parallel to the first direction and two third lengthwise sides substantially parallel to the second direction, and the third lengthwise side is substantially shorter than the first lengthwise side.

13. The contact pad array according to claim 12, further comprising:
a plurality of third wires respectively connected to the third widthwise side, which is near the edge of the surface, of each third contact pad.

14. The contact pad array according to claim 12, wherein each third wire is connected to one of the third lengthwise sides of each third contact pad.

* * * * *